United States Patent
Hamada

[11] Patent Number: 6,114,715
[45] Date of Patent: Sep. 5, 2000

[54] DISPLAY APPARATUS USING ELECTROLUMINESCENCE ELEMENTS

[75] Inventor: Hiroki Hamada, Hirakata, Japan

[73] Assignee: Sanyo Electric Co., Ltd., Osaka, Japan

[21] Appl. No.: 08/969,363

[22] Filed: Nov. 28, 1997

[30] Foreign Application Priority Data

| Nov. 29, 1996 | [JP] | Japan | ................................. 8-320107 |
| Dec. 10, 1996 | [JP] | Japan | ................................. 8-329825 |

[51] Int. Cl.[7] .................. H01L 29/04; H01L 31/036; H01L 33/00
[52] U.S. Cl. ................. 257/72; 257/59; 257/88; 257/90; 257/93; 257/98
[58] Field of Search ................ 257/59, 72, 98, 257/94, 88, 90, 93

[56] References Cited

U.S. PATENT DOCUMENTS

| 4,006,383 | 2/1977 | Luo et al. | ................................. 315/169 |
| 4,984,034 | 1/1991 | Yamazaki | ................................. 357/17 |
| 5,151,803 | 9/1992 | Wakita et al. | ................................. 359/56 |
| 5,427,829 | 6/1995 | Mochizuki et al. | ................................. 428/1 |
| 5,446,562 | 8/1995 | Sato | ................................. 359/59 |
| 5,682,214 | 10/1997 | Amako et al. | ................................. 349/74 |
| 5,724,107 | 3/1998 | Nishikawa et al. | ................................. 349/38 |
| 5,736,752 | 4/1998 | Hseuh et al. | ................................. 257/72 |
| 5,777,707 | 7/1998 | Masaki et al. | ................................. 349/110 |
| 5,780,871 | 7/1998 | Den Boer et al. | ................................. 257/59 |
| 5,815,223 | 9/1998 | Watanabe et al. | ................................. 349/42 |
| 5,821,571 | 10/1998 | Lebby et al. | ................................. 257/98 |

FOREIGN PATENT DOCUMENTS 404268533  9/1992  Japan.

*Primary Examiner*—David Hardy
*Assistant Examiner*—Allan R. Wilson
*Attorney, Agent, or Firm*—Sheridan Ross P.C.

[57] ABSTRACT

A display apparatus using electroluminescence elements has a substrate, a plurality of anodes arranged generally parallel to each other on a surface of the substrate, and the EL element disposed on the substrate and the anodes. In addition, a material layer is located on the substrate and between the anodes. The material layer may be either a black matrix layer constructed of a light shielding film or a highly reflective multilayer film which suppresses optical crosstalk caused by light scattering originated in the EL element. The material layer covers the anodes such that only a part of each anode corresponding to a display area is exposed. The display apparatus may be used in either a simple matrix display system or an active matrix display system.

39 Claims, 8 Drawing Sheets

DISPLAY APPARATUS USING ELECTROLUMINESCENCE ELEMENTS

BACKGROUND OF THE INVENTION

The present invention relates generally to a display apparatus using electroluminescence elements. More particularly, the present invention relates to a display apparatus which displays high-definition images.

Electroluminescence (EL) elements include an inorganic EL element which uses a thin film of an inorganic compound like ZnS or ZnSe as a light emitting material, and an organic EL element which uses an organic compound as a light emitting material. The organic EL element has the following features: (1) high light emitting efficiency, (2) low driving voltage, (3) ability to display multicolors (green, red, blue, yellow, etc.) by selection of a light emitting material in use, (4) clear display and no need for a back light because it is of a self light emission type, (5) planar light emission and no dependency on the angle of visibility, (6) Physically thin and light, and (7) decreasing temperature in the fabrication process, which allows a soft material like a plastic film to be used for the substrate. A display apparatus using an organic EL element having the aforementioned properties (hereinafter called an "organic EL display apparatus") has recently been getting attention as a replacement for a CRT or LCD display device.

An organic EL display apparatus can employ either a simple matrix system or an active matrix system. The simple matrix system allows an external driving unit to directly drive organic EL elements as a matrix of pixels, arranged on a display panel, in synchronism with a scan signal. Because the display panel of any display apparatus which employs such a system includes organic EL elements, the driving time (duty) assigned to each pixel decreases as the number of scan lines is increased, which lowers the contrast of an image displayed on the display panel.

The active matrix system has the elements (active elements) for driving pixels, respectively, for a matrix of pixels. The element serves as a switch which is switched on or off by the scan signal. When an element for driving a pixel is enabled, a data signal (display signal, video signal) is transmitted and written, via the element for driving pixel, to an anode of the associated organic EL element. The organic EL element is driven in this manner. When the element for driving pixel is disabled later, the data signal applied to the anode of the organic EL element is held as a charge in the organic EL element. The organic EL element is kept driven by the discharging of charges until the associated element for driving pixel is switched on again. Thus, even though the driving time per pixel becomes shorter when the number of scan lines is increased, the driving of the organic EL elements is not affected. As a result, the contrast is prevented from becoming lower. In this respect, the active matrix system displays images with a higher quality than the simple matrix system.

The active matrix system employs transistor type (three-terminal type) elements for driving the pixels or diode type (two-terminal type) elements for driving the pixels. The transistor type is characterized by easy acquisition of high contrast and high resolution, but difficult to fabricate, as compared with the diode type. That is, the transistor type organic EL display apparatus provides high-definition images which match with those displayed by a CRT. The operational principle of the active matrix system is mainly associated with the transistor type elements for driving pixels.

FIG. 1 is a schematic cross-sectional perspective view showing a part of a prior art organic EL display apparatus 101 according to a simple matrix system. FIG. 2 is a schematic cross-sectional view taken along line 2—2 in FIG. 1.

Referring to FIGS. 1 and 2, a plurality of anodes 103 formed of transparent electrodes of ITO (Indium Tin Oxide) or the like and a first hole transporting layer 104 of MTDATA (4,4'-bis(3-methylphenylphenylamino)biphenyl) are provided on a transparent insulator substrate 102 of glass, synthetic resin or the like. A second hole transporting layer 105 of TPD (4,4',4"-tris(3-methylphenylphenylamino) triphenylamine) is located on the first hole transporting layer 104. Located on the second hole transporting layer 105 is a light emitting layer 106 of Bebq2(10-benzo[h]quinolinol-beryllium complex) containing a quinacridone dielectric substance. Provided on the light emitting layer 106 is an electron transporting layer 107 of Bebq2. A plurality of cathodes 108 of a magnesium-indium alloy are located on the electron transporting layer 107. The layers 104 to 107 each of an organic compound, the anodes 103, and the cathodes 108 form an organic EL element 109.

The individual anodes 103 are arranged parallel to one another. The individual cathodes 108 are likewise arranged parallel to one another, and perpendicular to the anodes 103.

As the holes from the anodes 103 are recombined with the electrons from the cathodes 108 inside the light emitting layer 106, the light emitting layer 106 generates light. The light from the light emitting layer 106 is emitted outside from the anodes 103 through the transparent insulator substrate 102 as indicated by the arrow τ (FIG. 2).

The first and second hole transporting layers 104 and 105 facilitate the injection of holes into the light emitting layer 106 from the anodes 103. The electron transporting layer 107 facilitates the injection of electrons into the light emitting layer 106 from the cathodes 108. An organic EL display apparatus 101 having the structure permits green light to be emitted at higher external quantum efficiency and improved intensity.

FIG. 3 is a plan view of the organic EL display apparatus 101, as viewed from the anodes 103. In FIG. 3, only the anodes 103 (103a–103c) and the cathodes 108 (108a–108c) are illustrated. The individual intersections of anodes 103a to 103c and cathodes 108a to 108c are defined as light emitting areas B or pixels. In the simple matrix system, the positive terminal of a driving power supply (not shown) is connected to the anodes 103 corresponding to the light emitting areas B, while the negative terminal of the driving power supply is connected to the corresponding cathodes 108. As the anodes 103 and cathodes 108 are energized, the desired pixels emit light.

For example, if the positive terminal of the driving power supply is connected to the anode 103b and the power-supply's negative terminal is connected to the cathode 108a, power is provided to the anode 103b and the cathode 108a, and a forward current flows, as indicated by the arrow α, causing the light emitting area B at the intersection C to emit light. At this time, a leak current may flow as indicated by the arrow β, energizing the light emitting area B at an intersection close to the intersection C. As a result, the light emitting areas B at the intersection D between the anode 103a and cathode 108a, the intersection E between the anode 103c and cathode 108a, and at the intersection F between the anode 103b and cathode 108b, as well as the light emitting area B at the intersection C may emit light. This phenomenon is called optical crosstalk caused by the leak current characteristic of the EL element.

Further, light emitted from the light emitting layer 106 may be scattered inside the electron transporting layer 107 and reflected at some cathode 108 to go outside, as indicated by the arrow δ (FIG. 2). Furthermore, light emitted from the light emitting layer 106 may be scattered inside the first and second hole transporting layers 104 and 105, and go out, as indicated by the arrow ε (FIG. 2). In addition, light emitted from the light emitting layer 106 may optically be guided out by the optical waveguide effect which originates from the difference between the refractive indexes of the light emitting layer 106 and the first and second hole transporting layers 104 and 105, as indicated by the arrow η. Such radiative actions bring about undesirable light emission from a non-radiative area. This phenomenon is called optical crosstalk caused by the light scattering originated from the structure of the EL element.

The aforementioned two optical crosstalks deteriorate the contrast of the organic EL display apparatus 101, thereby lowering the resolution. This makes it difficult to acquire high-definition images. In a full-color display apparatus, particularly, color "bleeding" occurs, which disables the acquisition of clear images. Such a shortcoming occurs not only in the simple matrix system, but also in the active matrix system, and may occur in an inorganic EL display apparatus as well as an organic EL display apparatus.

Broadly speaking, the present invention relates to a display apparatus using electroluminescence elements, which displays high-definition images.

SUMMARY OF THE INVENTION

Briefly stated, the present invention provides a display apparatus including: a light emitting element layer having first and second surfaces; a plurality of first electrodes arranged, generally parallel to one another, over the first surface of the light emitting element layer; a plurality of second electrodes arranged, generally parallel to one another and intersecting the first electrodes, over the second surface of the light emitting element layer, with electroluminescence elements formed at individual intersections of the first electrodes and the second electrodes; and a black-matrix layer having an insulation property, arranged over at least one of the first and second surfaces so as to expose at least the electroluminescence elements.

The present invention further provides a display apparatus including: a transparent insulator substrate; a plurality of first electrodes arranged, generally parallel to one another, on a surface of the transparent insulator substrate; a black-matrix layer having an insulation property and a light-shielding property, arranged on the surface of the transparent insulator substrate between the first electrodes; a light emitting element layer having first and second surfaces and provided above the first electrodes and the black-matrix layer; and a plurality of second electrodes arranged, in parallel to one another and intersecting the first electrodes, over the light emitting element layer, with electroluminescence elements formed at individual intersections of the first electrodes and the second electrodes.

The present invention also provides a display apparatus including: a transparent insulator substrate; a plurality of first electrodes arranged, generally parallel to one another, on a surface of the transparent insulator substrate; an insulator film provided on the surface of the transparent insulator substrate between the first electrodes and on side walls of the first electrodes; a black-matrix layer having a light-shielding property, located on the insulator film; a light emitting element layer having first and second surfaces, provided above the first electrodes and the black-matrix layer; and a plurality of second electrodes arranged, generally parallel to one another and intersecting the first electrodes, over the light emitting element layer, with electroluminescence elements formed at individual intersections of the first electrodes and the second electrodes.

The present invention provides a display apparatus including: a transparent insulator substrate; a plurality of first electrodes arranged, generally parallel to one another, on a surface of the transparent insulator substrate; a high-reflection multilayer film located on the surface of the transparent insulator substrate between the first electrodes; a light emitting element layer having first and second surfaces, provided above the first electrodes and the high-reflection multilayer film; and a plurality of second electrodes arranged, generally parallel to one another and intersecting the first electrodes, over the light emitting element layer, with electroluminescence elements formed at individual intersections of the first electrodes and the second electrodes.

The present invention further provides a pixel for an active matrix display apparatus. The pixel includes: a transparent insulator substrate; an element for driving a pixel disposed on a first surface of the transparent insulator substrate, the element for driving a pixel including a source electrode and a drain electrode; an interlayer insulator film disposed on the transparent insulator substrate and covering the driving element; a flattening insulator film formed on the source and drain electrodes and the interlayer insulator film; an anode formed on the flattening insulator film; a black matrix layer disposed on the flattening insulator film adjacent to the anode; and an organic electroluminescence (EL) element formed on the anode.

The present invention can be implemented in numerous ways including as an apparatus and a method. Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
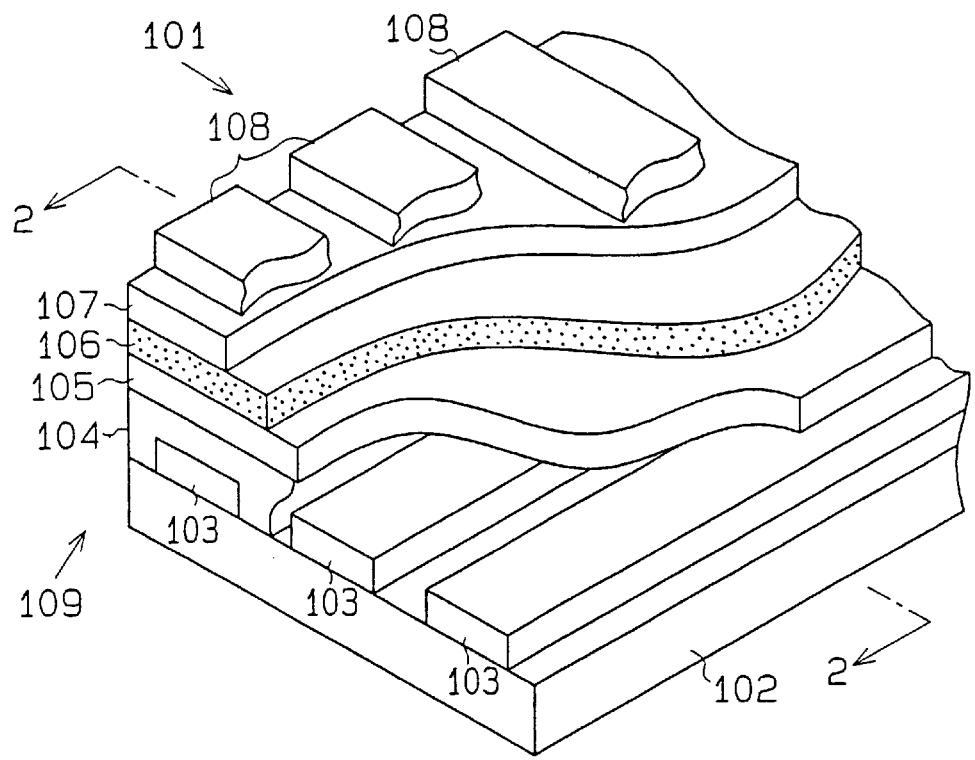
FIG. 1 is a schematic cross-sectional perspective view showing a part of a conventional organic EL display apparatus according to a simple matrix system.
Figure 2:
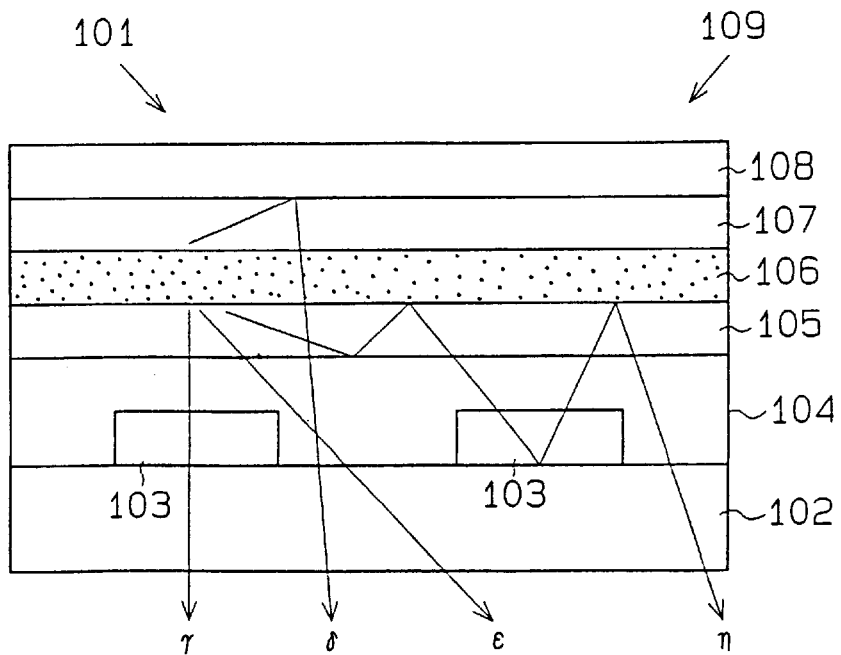
FIG. 2 is a partial schematic cross-sectional view taken along the line 2—2 in FIG. 1.

The present invention will now be described with reference to the drawings. In the drawings, like numerals are used to describe like elements throughout.

First Embodiment

Figure 4:
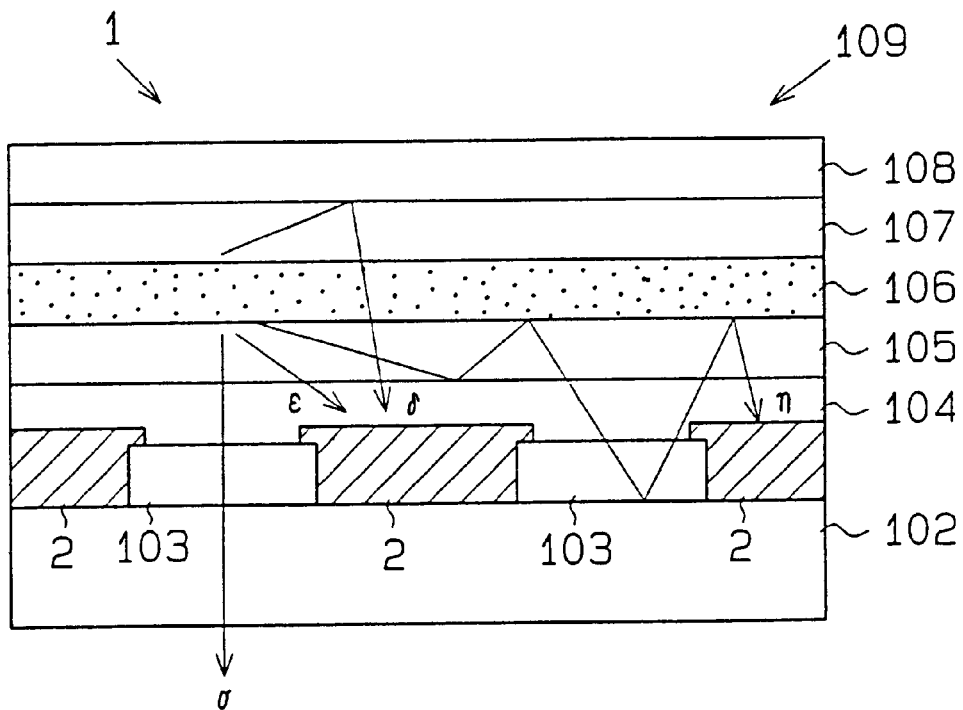
FIG. 4 is a schematic cross-sectional view showing a part of an organic EL display apparatus of a simple matrix system according to a first embodiment of the present invention.

A display apparatus according to a first embodiment of the present invention will now be described referring to the accompanying drawings. FIG. 4 is a schematic cross-sectional view showing a part of an organic EL display apparatus 1 of the simple matrix system according to the first embodiment.

Provided on the transparent insulator substrate 102 of glass, synthetic resin or the like, are a plurality of anodes 103 formed of transparent electrodes, such as of ITO (Indium Tin Oxide) or the like, and a black-matrix layer 2. The black-matrix layer 2 preferably comprises a light-shielding film having an insulation property. A first hole transporting layer 104 of MTDATA (4,4',4"-tris(3-methylphen ylphenylamino) triphenylamine) is located on the anodes 103 and the black-matrix layer 2. A second hole transporting layer 105 of TPD (4,4'-bis(3-methylphenylphenylamino)biphen yl) is located on the first hole transporting layer 104. Located on the second hole transporting layer 105 is a light emitting layer 106, which preferably comprises Bebq2(10-benzo[h] quinolinol-beryllium complex) and contains quinacridone dielectric substance. Provided on the light emitting layer 106 is an electron transporting layer 107, which preferably comprises Bebq2. A plurality of cathodes 108 of a magnesium-indium alloy are located on the electron transporting layer 107. As will be understood by those of ordinary skill in the art, the first hole transporting layer 104 or the second hole transporting layer 105 may be omitted, or both may be omitted, and the electron transporting layer 107 may be omitted.

Figure 3:
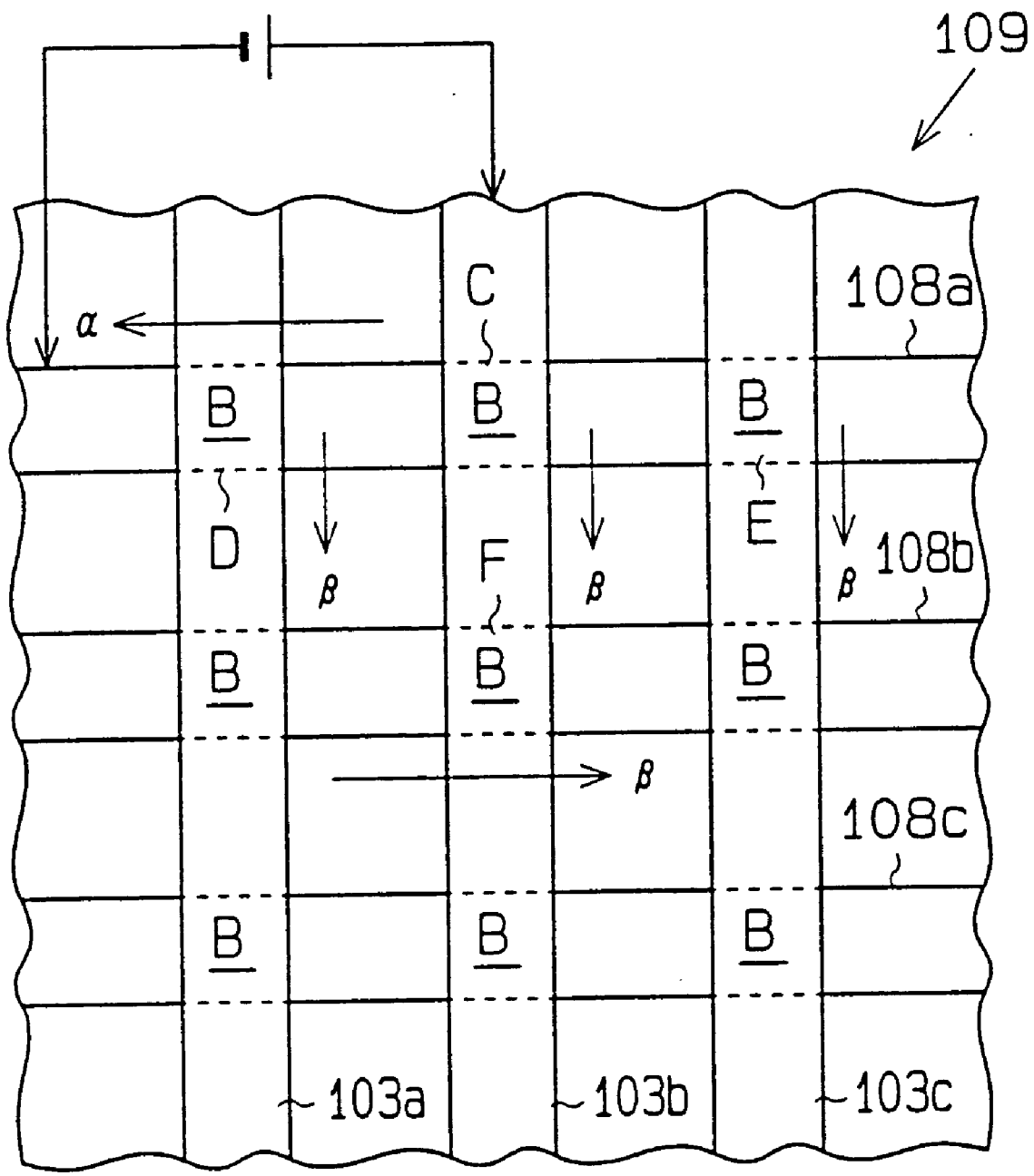
FIG. 3 is a schematic plan view of an organic EL display apparatus as viewed from anodes 103.

The black-matrix layer 2 is located on the transparent insulator substrate 102 between the individual anodes 103. In other words, the black-matrix layer 2 is formed to bury the grooves between the anodes 103. The black-matrix layer 2 is formed to cover the anodes 103 such that only a part of each anode 103 corresponding to the display area (the light emitting area B in FIG. 3) remains or is exposed.

The preferable material for the black-matrix layer 2 is a coated insulator film (silicon-based resin film, polyimide-based resin film, SOG (Spin On Glass) film or the like), containing fine particles (carbon black or the like) having a light-shielding property, or a polymer film having a light-shielding property. Further, it is preferable that the black matrix layer 2 be formed of a material which does not adversely affect the anodes 103 at the time the layer 2 is formed.

The black-matrix layer 2 improves the insulation between the anodes 103 and hampers the flow of the leak current. That is, the occurrence of optical crosstalk caused by the leak current characteristic of the EL element is suppressed.

The black-matrix layer 2 also blocks the light, which has been scattered inside the electron transporting layer 107 and reflected at some cathode 108, as indicated by the arrow δ in FIG. 4. The black-matrix layer 2 also shields the light, which has been scattered inside the individual hole transporting layers 104 and 105 as indicated by the arrow ε. The black-matrix layer 2 further blocks the light, which has optically been guided by the optical waveguide effect that is originated from the difference between the refractive indexes of the light emitting layer 106 and the hole transporting layers 104 and 105, as indicated by the arrow η. The above light-shielding property of the black matrix layer 2 suppresses the occurrence of optical crosstalk caused by the light scattering originated from the structure of the EL element 109.

The suppression of the two optical crosstalks enhances the contrast and thus improves the resolution, thereby permitting the display apparatus 1 to produce high-definition images. When the display apparatus 1 is adapted to a full-color organic EL display apparatus, particularly clear images with less color "bleeding" can be obtained.

The color of light emitted by an organic EL element 109 can be changed by the selection of materials for the organic compound that forms the light emitting layer 106. Specifically, it is preferable that OXD (oxadiazole) or AZM (azomethine-zinc complex) should be used for the emission of blue light, PYR (pyrazoline) should be used for the emission of blue green light, Znq2(8-quinolinol-zinc complex) should be used for the emission of yellow light, and ZnPr(porphyrin-zinc complex) should be used for the emission of red light.

Second Embodiment

Figure 5:
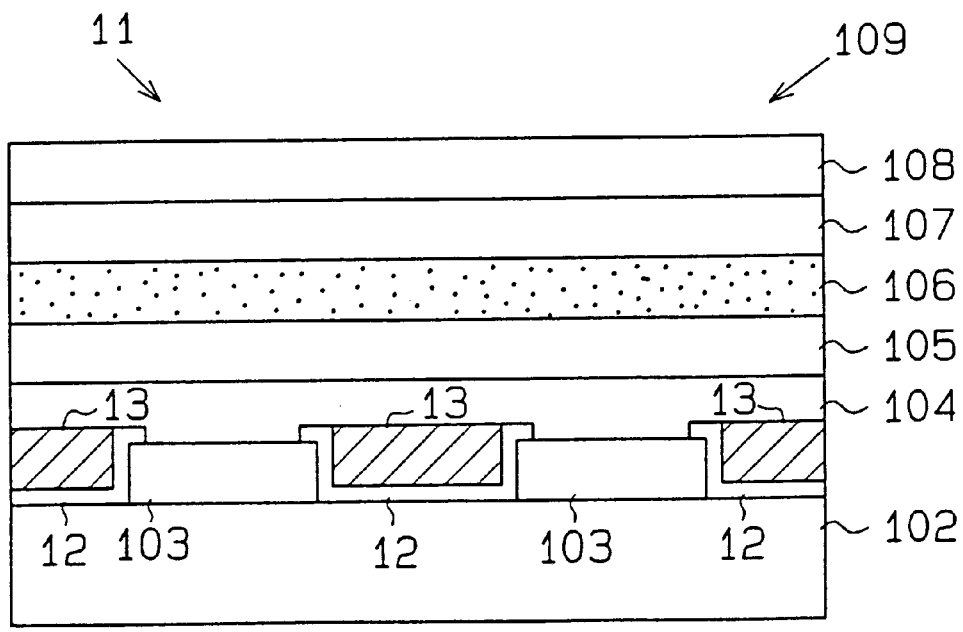
FIG. 5 is a schematic cross-sectional view showing a part of an organic EL display apparatus of a simple matrix system according to a second embodiment of the present invention.

FIG. 5 is a schematic cross-sectional view showing a part of an organic EL display apparatus 11 of the simple matrix system according to a second embodiment of the present invention. The organic EL display apparatus 11 of the second embodiment differs from the organic EL display apparatus 1 of the first embodiment, as follows.

(1) An insulator film 12 is formed on the exposed surface portions of the transparent insulator substrate 102 between the anodes 103 and on the side walls of the anodes 103. The insulator film 12 should preferably be thinner than each anode 103. It is also preferable that the material for the insulator film 12 be a silicon oxide film or a silicon nitride film, formed by CVD (Chemical Vapor Deposition), or a coated insulator film (silicon-based resin film, polyimide-based resin film, SOG (Spin On Glass) film or the like). Further, the insulator film 12 should preferably be formed of a material which does not adversely affect the anodes 103 at the time the film 12 is formed. According to the second embodiment, the insulator film 12 serves to improve the insulation between the anodes 103 and to obstruct the flow of the leak current.

(2) A black-matrix layer 13 comprised of a light-shielding film is formed on the insulator film 12. The black-matrix layer 13 in the second embodiment is so formed on the insulator film 12 as to bury the grooves between the anodes 103. It is preferable that the black-matrix layer 13 comprises a metal film (chrome film, titanium film or the like) which has a light-shielding property, preferably by using PVD (Physical Vapor Deposition).

Third Embodiment

Figure 6:
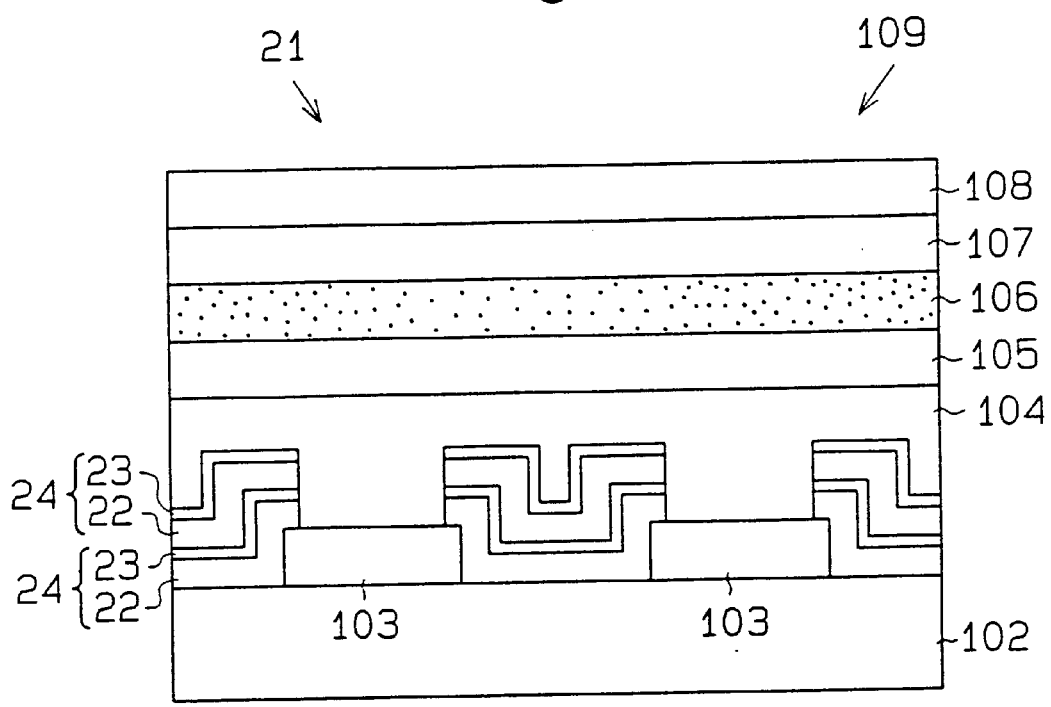
FIG. 6 is a schematic cross-sectional view showing a part of an organic EL display apparatus of a simple matrix system according to a third embodiment of the present invention.

FIG. 6 is a schematic cross-sectional view showing a part of an organic EL display apparatus 21 of the simple matrix system according to a third embodiment of the present invention. The third embodiment differs from the first embodiment as follows.

(1) A silicon oxide film 22 is formed on the exposed surface portions of the transparent insulator substrate 102 between the anodes 103 and on the side walls of the anodes 103. The silicon oxide film 22 should preferably be thinner than each anode 103. An amorphous silicon film 23 is formed on the silicon oxide film 22. The silicon oxide film 22 and the amorphous silicon film 23 form a first high-reflection multilayer film 24. The first high-reflection multilayer film 24 is so formed as to bury the grooves between the anodes 103. The individual films 22 and 23 should preferably be formed by a CVD method, a sputtering method or a depositing method. The silicon oxide film 22 serves to improve the insulation between the anodes 103 and to hinder the flow of the leak current.

(2) A second high-reflection multilayer film 24 is located on the first high-reflection multilayer film 24. The second high-reflection multilayer film 24 comprises a silicon oxide film 22 and amorphous silicon film 23. The first and second high-reflection multilayer films 24 are formed to cover the anodes 103 in such a way that only a part of each anode 103 corresponding to the display area (the light emitting area B in FIG. 3) remains or is exposed.

It is preferable that the refractive indexes and the thicknesses of the films 22 and 23 be set in such a manner that the general reflectance of the first and second high-reflection multilayer films 24 becomes maximum in association with the peak wavelength of the light emitting layer 106. When the peak wavelength of the light emitting layer 106 is 5400 Å, for example, the reflectance n of the silicon oxide film 22 is set to 1.4 and its thickness is set to 960 Å while the reflectance n of the amorphous silicon film 23 is set to 3.0 and its thickness is set to 450 Å. With those values set, the first and second high-reflection multilayer films 24 which have a general reflectance of 90% or greater can be acquired. The first and second high-reflection multilayer films 24 have a reflectance function like the black-matrix layer 2 of the first embodiment.

As mentioned above, the reflectance of the first and second high-reflection multilayer films 24 depends on the wavelength of the light emitting layer 106. When the present invention is adapted to a monochrome organic EL display apparatus, therefore, it is possible to selectively shield light of the wavelength of the light emitting layer 106. This effectively suppresses the occurrence of an optical crosstalk caused by light scattering which is originated from the structure of the EL element 109.

Figure 7:
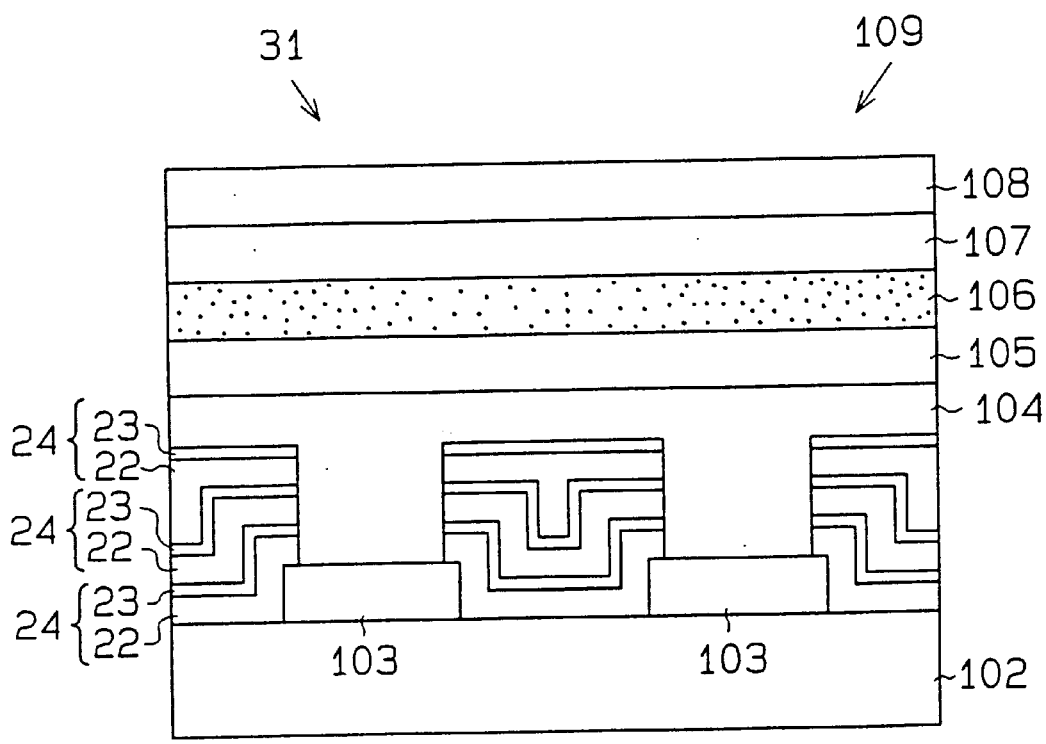
FIG. 7 is a schematic cross-sectional view showing a part of an organic EL display apparatus having a high-reflection multilayer film with a three-layer structure according to a modification of the third embodiment.

According to the present invention, three or more high-reflection multilayer films 24 may be provided. FIG. 7 is a schematic cross-sectional view showing a part of an organic EL display apparatus 31 having a high-reflection multilayer film 24 with a three-layer structure. Increasing the number of the high-reflection multilayer films 24 increases the reflectance of the organic element 109. It is therefore possible to surely suppress the occurrence of an optical crosstalk caused by light scattering originated from the structure of the EL element 109.

Fourth Embodiment

Figure 8:
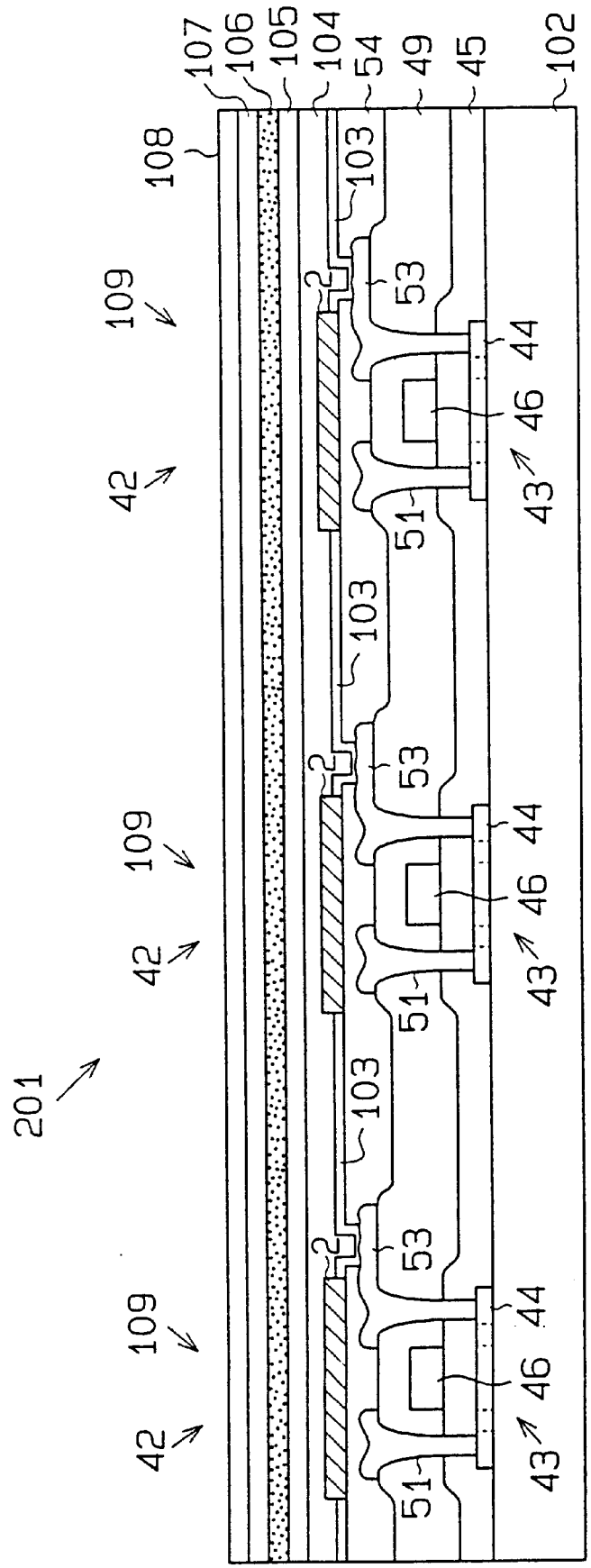
FIG. 8 is a schematic cross-sectional view of the display panel of an organic EL display apparatus of an active matrix system according to a fourth embodiment of the present invention.
Figure 9:
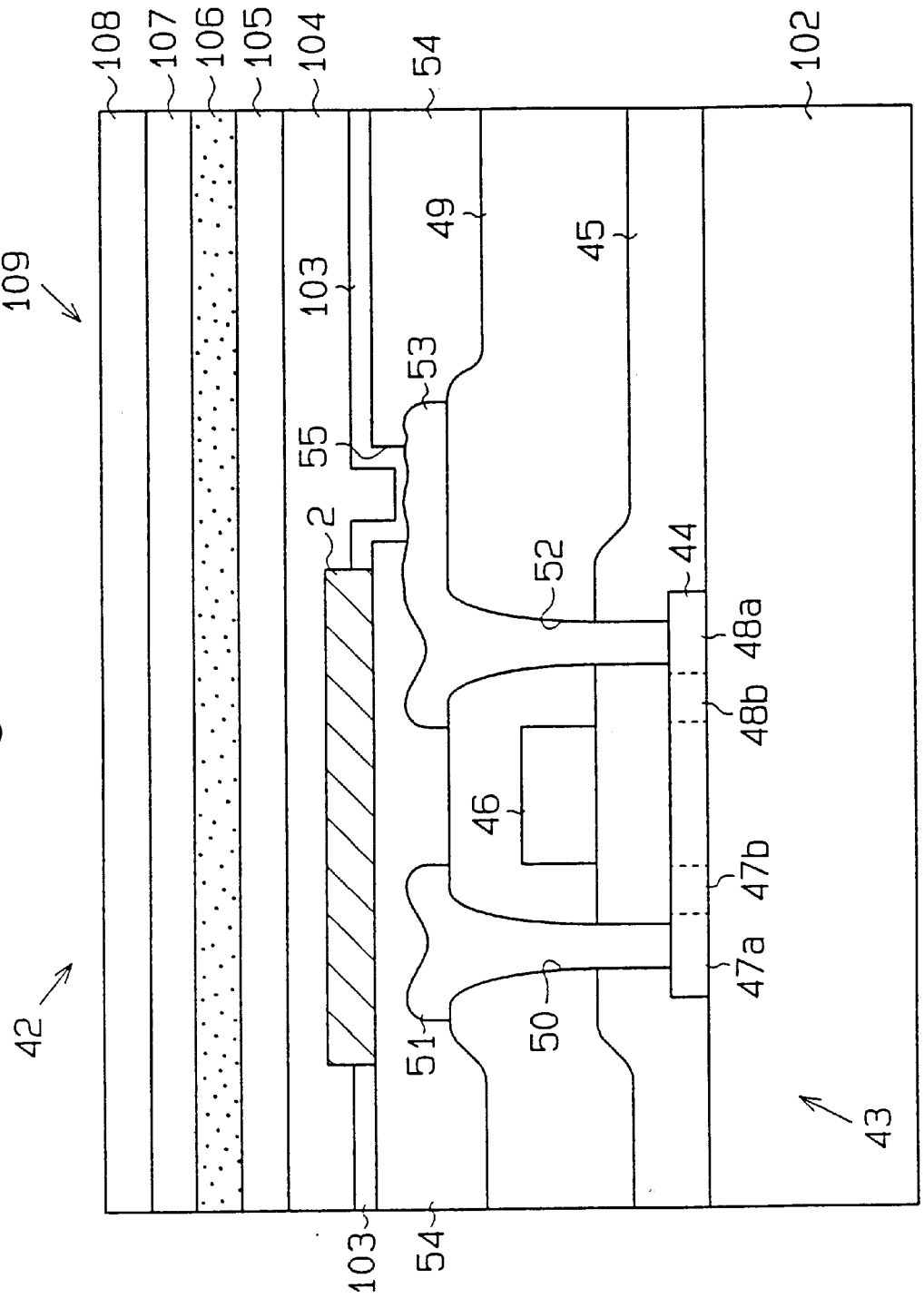
FIG. 9 is a schematic cross-sectional view of one pixel of the display panel in FIG. 8.

FIG. 8 is a schematic cross-sectional view of a display panel 201 of an organic EL display apparatus 41 of the active matrix system according to a fourth embodiment of the present invention. FIG. 9 is a schematic cross-sectional view of one pixel 42 of the display panel 201.

Each of the pixels 42, arranged in a matrix form on the display panel 201, has a thin film transistor (TFT) 43 as an element for driving a pixel. The TFT 43 is preferably a planar type, and has an LDD (Lightly Doped Drain) structure using a polycrystalline silicon film 44 as an active layer. The TFT 43 comprises the polycrystalline silicon film 44 formed on a transparent insulator substrate 102, a gate insulator film 45 formed on the polycrystalline silicon film 44, and a gate electrode 46 formed on the gate insulator film 45. Defined on the polycrystalline silicon film 44 are a high-concentration drain region 47a, a low-concentration drain region 47b, a high-concentration source region 48a and a low-concentration source region 48b (see FIG. 9).

An interlayer insulator film 49 is provided on the transparent insulator substrate 102 to cover each TFT 43. The high-concentration drain region 47a is connected to a drain electrode 51 via a contact hole 50 which penetrates the interlayer insulator film 49. The high-concentration source region 48a is connected to a source electrode 53 via a contact hole 52 which penetrates the interlayer insulator film 49.

A flattening insulator film 54 is formed on the electrodes 51 and 53 and the interlayer insulator film 49. A contact hole 55 is formed in the flattening insulator film 54. An anode 103, connected via the contact hole 55 to the source electrode 53, is provided on the flattening insulator film 54. A black-matrix layer 2 is provided on the exposed surface of the flattening insulator film 54 between adjoining anodes 103. In other words, the black-matrix layer 2 is so formed as to bury the grooves between the anodes 103. Further, the black-matrix layer 2 is so located on the polycrystalline silicon film 44 as to cover the top thereof.

Each of the gate insulator film 45 and the interlayer insulator film 49 is preferably formed of a silicon oxide film, silicon nitride film or a silicon nitride oxide film. The flattening insulator film 54 is preferably comprised of a silicon oxide film, silicon nitride film, a silicon nitride oxide film, a silicate glass film, a SOG (Spin On Glass) film or a synthetic resin film (polyimide-based resin film, organic silica film, acrylic resin film, etc.). The electrodes 51 and 53 are preferably formed of an aluminum alloy film.

Figure 10:
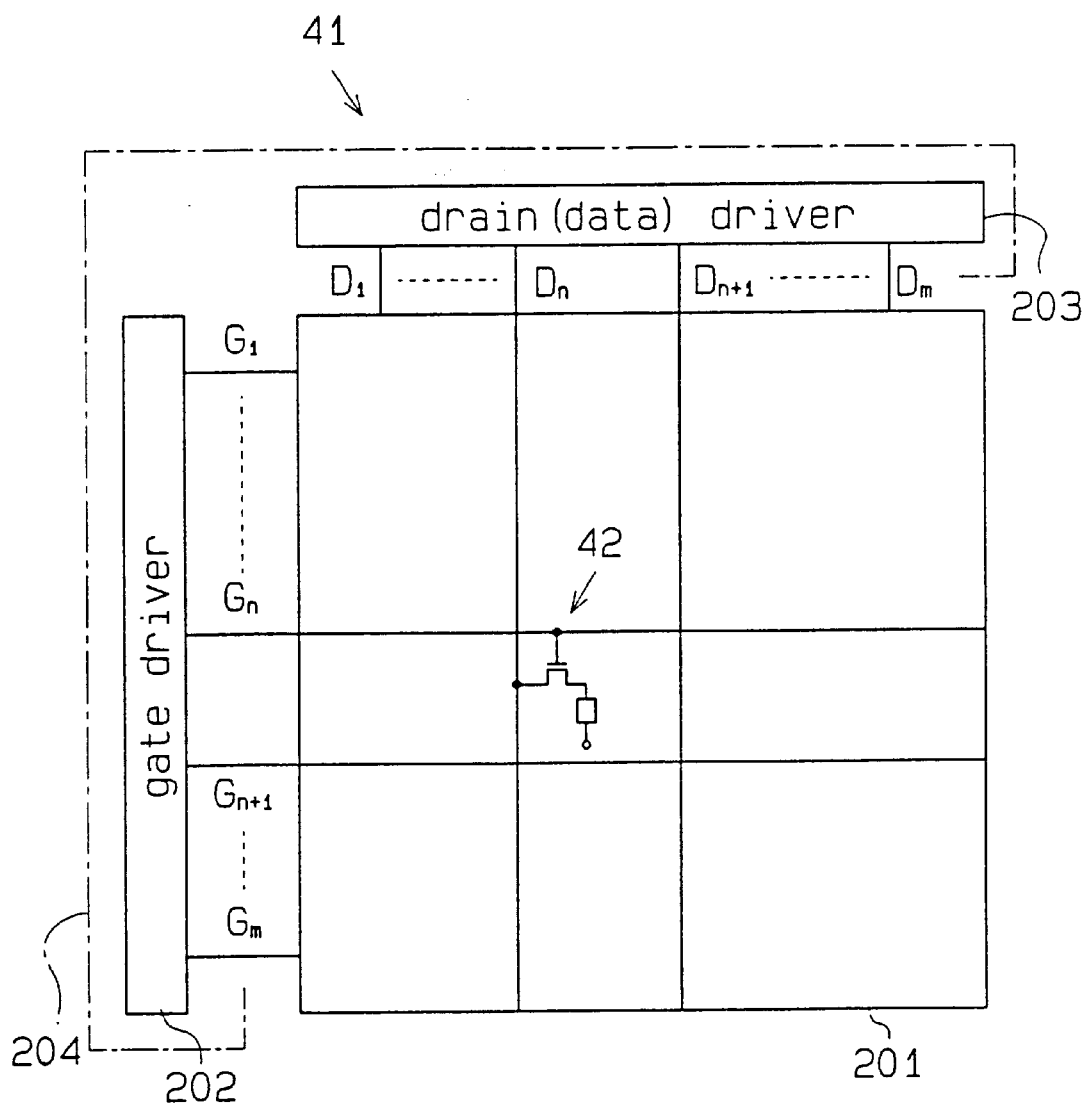
FIG. 10 is a schematic block diagram illustrating the organic EL display apparatus according to the fourth embodiment.

FIG. 10 is a schematic diagram of the organic EL display apparatus 41 according to the fourth embodiment. The organic EL display apparatus 41 includes the display panel 201, a gate driver 202, and a drain driver (data driver) 203.

The display panel 201 has a plurality of gate lines (scan lines) G1, . . . , Gn, Gn+1, . . . , and Gm, a plurality of drain lines (data lines) D1, . . . , Dn, Dn+1, and Dm, and pixels 42 located at the perpendicular intersections of the gate lines G1 to Gm and the drain lines D1 to Dm. The screen of the display panel 201 comprises the matrix of the pixels 42. The gate lines G1 to Gm are formed by the gate electrodes 46 of the TFTs 43. The drain lines D1 to Dm are formed by the drain electrodes 51 of the TFTs 43.

The gate driver 202, connected to the individual gate lines G1 to Gm, applies a gate signal (scan signal) to the gate lines G1 to Gm. The drain driver 203, connected to the individual drain lines D1 to Dm, applies a data signal thereto. The drivers 202 and 203 comprise a peripheral driving circuit 204.

Figure 11:
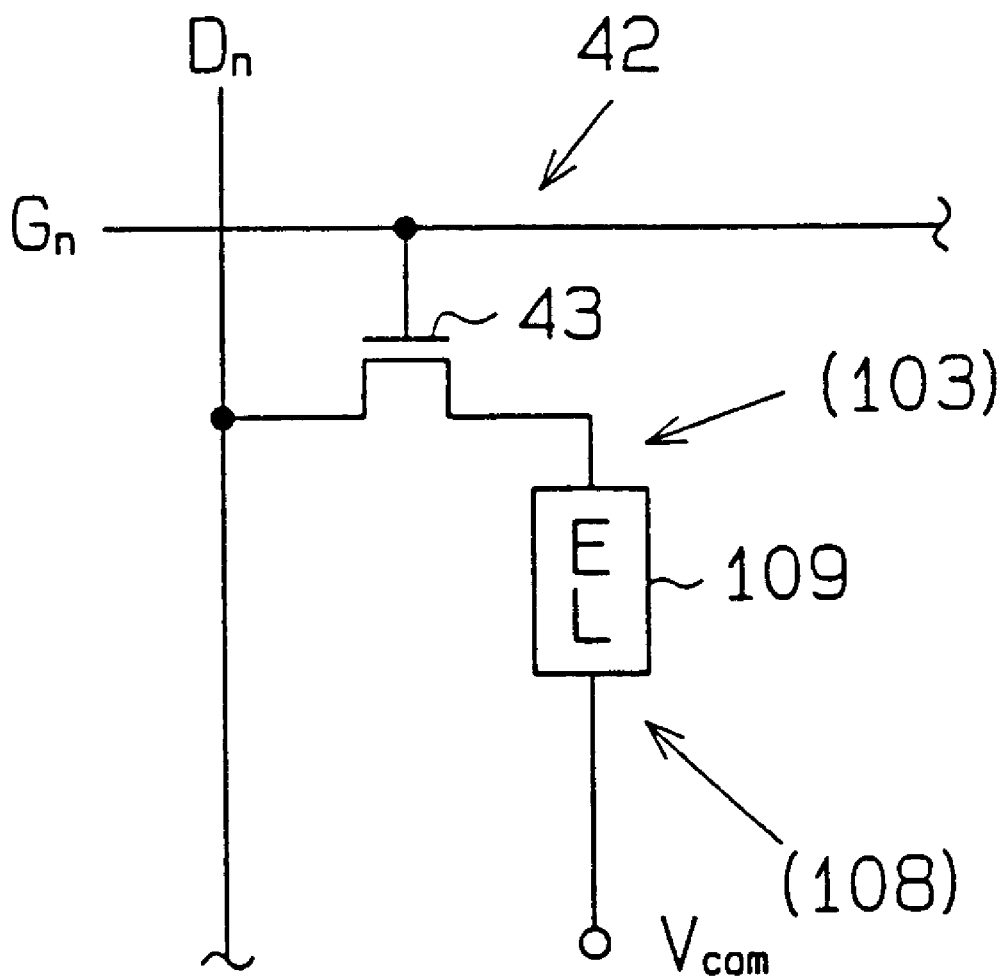
FIG. 11 shows an equivalent schematic circuit diagram of the pixel in FIG. 9.

FIG. 11 shows an equivalent circuit of one of the pixels 42. A generally constant voltage Vcom is applied to the cathode 108 of the organic EL element 109. When a positive voltage is applied to the gate electrode 46 of the TFT 43, the TFT 43 is turned on. The ON action of the TFT 43 allows a data signal applied to the drain line Dn to be stored in the capacitor of the organic EL element 109, thus, the data signal is written in the pixel 42. The organic EL element 109 is driven by the data signal. When a negative voltage is applied to the gate electrode 46 of the TFT 43, the TFT 43 is turned off. The OFF action of the TFT 43 causes the data signal, currently applied to the drain line Dn, to be held as a charge in the capacitor of the organic EL element 109. The driving of the organic EL element 109 is maintained by the discharging of the charge until the TFT 43 is turned on again. Even when the driving time assigned to one pixel 42 becomes shorter due to an increase in the number of gate lines (scan lines), the organic EL elements 109 of the organic EL display apparatus 41 according to such an active matrix system can be driven sufficiently. This prevents lowering of the contrast of an image displayed on the screen of the display panel 201.

Each TFT 43 is formed to have an LDD structure using the polycrystalline silicon film 44 as an active layer. It is therefore possible to increase the ON/OFF ratio of the TFT 43 and suppress the leak current in the OFF state.

According to the fourth embodiment, the black-matrix layer 2 is located above the polycrystalline silicon film 44 which serves as an active layer of the TFT 43. Thus, the light emitted from the light emitting layer 106 is blocked by the black-matrix layer 2 and is not irradiated on the polycrystalline silicon film 44. This prevents the electric characteristic of the TFT 43 from being degraded by deterioration of the silicon film 44.

The source electrode 53 ensures a good ohmic contact between the high-concentration source region 48a and the anode 103. If the source electrode 53 is omitted, the high-concentration source region 48a and the anode 103 are directly connected to each other, i.e., a hetero junction is formed. The hetero junction brings about an energy gap associated with the band gap difference, so that a good ohmic contact cannot be provided. In this case, the data signal applied to any of the drain lines D1 to Dm cannot be accurately written in the target pixel 42, which degrades the image quality of the organic EL display apparatus 41.

As will be understood by those of ordinary skill in the art, the drain regions 47a and 47b of the TFT 43 may be source regions, the drain electrode 51 may be a source electrode, the source regions 48a and 48b may be drain regions, and the source electrode 53 may be a drain electrode. In this case, the drain lines D1 to Dm become source lines, and the drain driver 203 becomes a source driver.

According to the fourth embodiment, the black-matrix layer 2 may be replaced with the black-matrix layer 13 of the second embodiment or the high-reflection multilayer film 24 of the third embodiment.

It should be apparent to those skilled in the art that the present invention may be embodied in many other specific forms without departing from the spirit or scope of the invention. For example, the present invention may be adapted to a display apparatus using TFTs with an SD (Single Drain) structure or a double gate structure. The present invention may further be adapted to a display apparatus which uses TFTs of a reversed planar type, a staggered type or a reverse staggered type. The present invention may also be adapted to a display apparatus which has TFTs each using an amorphous silicon film as an active layer. The present invention may be adapted to an organic EL display apparatus of a transistor type which uses bulk transistors as elements for driving the pixels or an organic EL display apparatus of a diode type which uses diodes as elements for driving a pixel. The diode type elements for driving the pixels include an MIM (Metal Insulator Metal) diode, ZnO (Zinc Oxide) varistor, MSI (Metal Semi-Insulator) diode, BTB (Back to Back) diode and RD (Ring Diode). The present invention may also be adapted to a display apparatus which uses inorganic EL elements.

Therefore, the present examples and embodiments are to be considered as illustrative and not restrictive and the invention is not to be limited to the details given herein, but may be modified within the scope and equivalence of the appended claims.

What is claimed is:

1. An electroluminescent display apparatus comprising:
   a light emitting element layer having first and second surfaces, wherein the light emitting element layer includes a light emitting layer, a hole transporting layer and an electron transporting layer;
   a plurality of first electrodes arranged, generally parallel to one another, over the first surface of the light emitting element layer;
   a plurality of second electrodes arranged, generally parallel to one another and crossing the first electrodes, over the second surface of the light emitting element layer, with electroluminescence elements formed at individual crossings of the first electrodes and the second electrodes; and
   a black-matrix layer having an insulation property, arranged adjacent to at least one of the first and second surfaces between the first electrodes so as to expose at least the electroluminescence elements.

2. The electroluminescent display apparatus according to claim 1, further comprising driving elements, provided above at least one of the first and second surfaces, for driving the associated electroluminescence elements.

3. The electroluminescent display apparatus according to claim 2, wherein the driving elements are thin film transistors.

4. The electroluminescent display apparatus according to claim 1, wherein the light emitting element layer is formed of an organic compound.

5. An electroluminescent display apparatus comprising:
   a transparent insulator substrate;
   a plurality of first electrodes arranged, generally parallel to one another, on a surface of the transparent insulator substrate;
   a black-matrix layer having an insulation property and a light-shielding property, arranged on the surface of the transparent insulator substrate between the first electrodes;
   a light emitting element layer having first and second surfaces and provided above the first electrodes and the black-matrix layer, wherein the light emitting element layer includes a light emitting layer, a hole transporting layer and an electron transporting layer; and
   a plurality of second electrodes arranged, in parallel to one another and crossing the first electrodes, over the light emitting element layer, with electroluminescence elements formed at individual crossings of the first electrodes and the second electrodes.

6. The electroluminescent display apparatus according to claim 5, further comprising driving elements, provided above at least one of the first and second surfaces, for driving the associated electroluminescence elements.

7. The electroluminescent display apparatus according to claim 6, wherein the driving elements are thin film transistors.

8. The electroluminescent display apparatus according to claim 5, wherein the light emitting element layer is formed of an organic compound.

9. An electroluminescent display apparatus comprising:

a transparent insulator substrate;

a plurality of first electrodes arranged, generally parallel to one another, on a surface of the transparent insulator substrate;

an insulator film provided on the surface of the transparent insulator substrate between the first electrodes and on side walls of the first electrodes;

a black-matrix layer having a light-shielding property, located on the insulator film;

a light emitting element layer having first and second surfaces, provided above the first electrodes and the black-matrix layer, wherein the light emitting element layer includes a light emitting layer, a hole transporting layer and an electron transporting layer; and a plurality of second electrodes arranged, generally parallel to one another and crossing the first electrodes, over the light emitting element layer, with electroluminescence elements formed at individual crossings of the first electrodes and the second electrodes.

10. The electroluminescent display apparatus according to claim 9, further comprising driving elements, provided above at least one of the first and second surfaces, for driving the associated electroluminescence elements.

11. The electroluminescent display apparatus according to claim 10, wherein the driving elements are thin film transistors.

12. The electroluminescent display apparatus according to claim 9, wherein the light emitting element layer is formed of an organic compound.

13. An electroluminescent display apparatus comprising:

a transparent insulator substrate;

a plurality of first electrodes arranged, generally parallel to one another, on a surface of the transparent insulator substrate;

a high-reflection multilayer film located on the surface of the transparent insulator substrate between the first electrodes;

a light emitting element layer having first and second surfaces, provided above the first electrodes and the high-reflection multilayer film, wherein the light emitting element layer includes a light emitting layer, a hole transporting layer and an electron transporting layer; and a plurality of second electrodes arranged, generally parallel to one another and crossing the first electrodes, over the light emitting element layer, with electroluminescence elements formed at individual crossings of the first electrodes and the second electrodes.

14. The electroluminescent display apparatus according to claim 13, wherein the high-reflection multilayer film comprises at least two layers.

15. The electroluminescent display apparatus according to claim 13, wherein the high-reflection multilayer film includes a silicon oxide film provided on the surface of the transparent insulator substrate between the first electrodes and an amorphous silicon film provided on the silicon oxide film.

16. The electroluminescent display apparatus according to claim 15, wherein thicknesses of the silicon oxide film and the amorphous silicon film are set in accordance with a peak wavelength of the light emitting element layer.

17. The electroluminescent display apparatus according to claim 13, further comprising driving elements, provided above at least one of the first and second surfaces, for driving the associated electroluminescence elements.

18. The electroluminescent display apparatus according to claim 17, wherein the driving elements are thin film transistors.

19. The electroluminescent display apparatus according to claim 13, wherein the light emitting element layer is formed of an organic compound.

20. A pixel for an active matrix display apparatus, the pixel comprising:

a transparent insulator substrate;

an element for driving a pixel disposed on a first surface of the transparent insulator substrate, the element for driving a pixel including a source electrode and a drain electrode;

an interlayer insulator film disposed on the transparent insulator substrate and covering the driving element;

a flattening insulator film formed on the source and drain electrodes and the interlayer insulator film;

an anode formed on the flattening insulator film;

a black matrix layer disposed on the flattening insulator film adjacent to the anode; and an organic electroluminescence (EL) element formed on the anode, wherein the element includes a light emitting layer, a hole transporting layer and an electron transporting layer.

21. The pixel of claim 20 wherein the element for driving a pixel comprises a thin film transistor (TFT).

22. The pixel of claim 21 wherein the TFT comprises a planar type transistor with a lightly doped drain (LDD) structure.

23. The pixel of claim 21 wherein an active layer of the TFT comprises a polycrystalline silicon film.

24. The pixel of claim 23 wherein the black matrix layer covers a top of the polycrystalline silicon film.

25. The pixel of claim 23 wherein light emitted by the light emitting layer of the EL element is blocked by the black matrix layer, such that the light is not irradiated on the polycrystalline silicon film.

26. The pixel of claim 21 wherein the TFT comprises:

a polycrystalline silicon film formed on the transparent insulator substrate;

a gate insulator film formed on the polycrystalline silicon film; and a gate electrode formed on the gate insulator film.

27. The pixel of claim 26 wherein the polycrystalline silicon film includes:

a high concentration drain region;

a low concentration drain region;

a high concentration source region; and a low concentration source region.

28. The pixel of claim 20 wherein the black matrix layer comprises a high-reflection multilayer film.

29. The electroluminescent display apparatus of claim 1 wherein the light emitting element layer internally generates light.

30. The electroluminescent display apparatus of claim 1 wherein the light emitting element layer is configurable to generate light of multiple colors.

31. The electroluminescent display apparatus of claim 1 wherein the electroluminescence element internally generates light.

32. The electroluminescent display apparatus of claim 1 wherein the electroluminescence element is configurable to generate light of multiple colors.

33. The electroluminescent display apparatus of claim 1 wherein:

the black-matrix layer is substantially opaque, and the first electrodes are at least partially translucent.

34. The electroluminescent display apparatus of claim 1 wherein the black-matrix layer is substantially coplanar with the first electrodes.

35. The electroluminescent display apparatus of claim 1 wherein:

the first electrodes have a thickness, and the black-matrix layer is coextensive with the thickness of the first electrodes.

36. The electroluminescent display apparatus of claim 9 wherein the black-matrix layer is an insulating material.

37. The electroluminescent display apparatus of claim 13 wherein the high-reflection multilayer film consists of a semiconductor material.

38. The electroluminescent display apparatus according to claim 1 wherein said black-matrix layer having an insulation property is located between said second surface of said light emitting element layer and said plurality of second electrodes.

39. The pixel of claim 20, wherein said black-matrix layer disposed on the flattening insulator film adjacent to the anode is disposed between the flattening insulator film and said light emitting layer.

* * * * *